United States Patent [19]

Dattilo

[11] Patent Number: 4,981,764
[45] Date of Patent: Jan. 1, 1991

[54] METHOD OF PROVIDING A INDICATION SIGNAL TO INDICATE A LEVEL OF ELECTROLYTE IN A WET CELL

[76] Inventor: Donald P. Dattilo, 2302 Taylorsville Rd., Louisville, Ky. 40205

[21] Appl. No.: 484,952

[22] Filed: Feb. 26, 1990

Related U.S. Application Data

[62] Division of Ser. No. 246,786, Sep. 20, 1988, Pat. No. 4,913,987.

[51] Int. Cl.$^5$ .............................................. H01M 10/48
[52] U.S. Cl. ......................................... 429/50; 429/93; 324/436
[58] Field of Search ................. 429/191, 192, 193, 50; 324/432, 433, 436

[56] References Cited

U.S. PATENT DOCUMENTS

| | | | |
|---|---|---|---|
| 3,600,234 | 8/1971 | Massie, Jr. | 429/93 |
| 3,832,629 | 8/1974 | Cernek, Jr. | 324/436 |
| 3,996,579 | 12/1976 | Dahl | 429/92 X |
| 4,052,717 | 10/1977 | Arnold et al. | 324/432 |

*Primary Examiner*—Anthony Skapars
*Attorney, Agent, or Firm*—Diller, Ramik & Wight

[57] ABSTRACT

A battery monitors by which an individual cell in a wet cell battery may be monitored for variations in the level of electrolyte contained in the cell. More specifically, the invention relates to a universal electrolyte level indicator which may be attached to, and made part of, battery powered mobile equipment of all types for the purposes of providing a warning indication to the operator of the equipment that water needs to be added to the batteries contained therein.

6 Claims, 5 Drawing Sheets

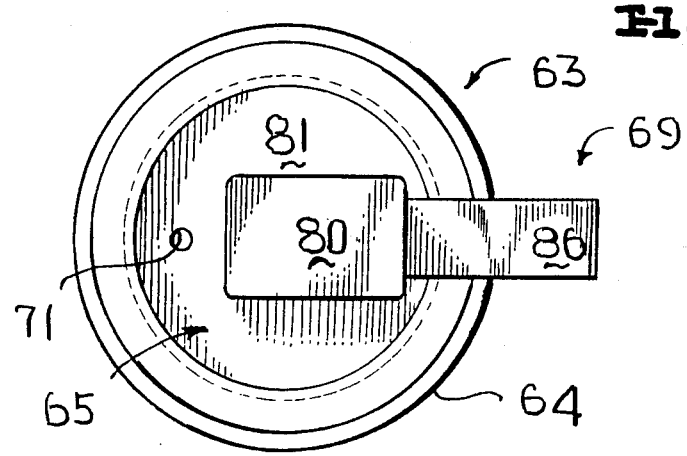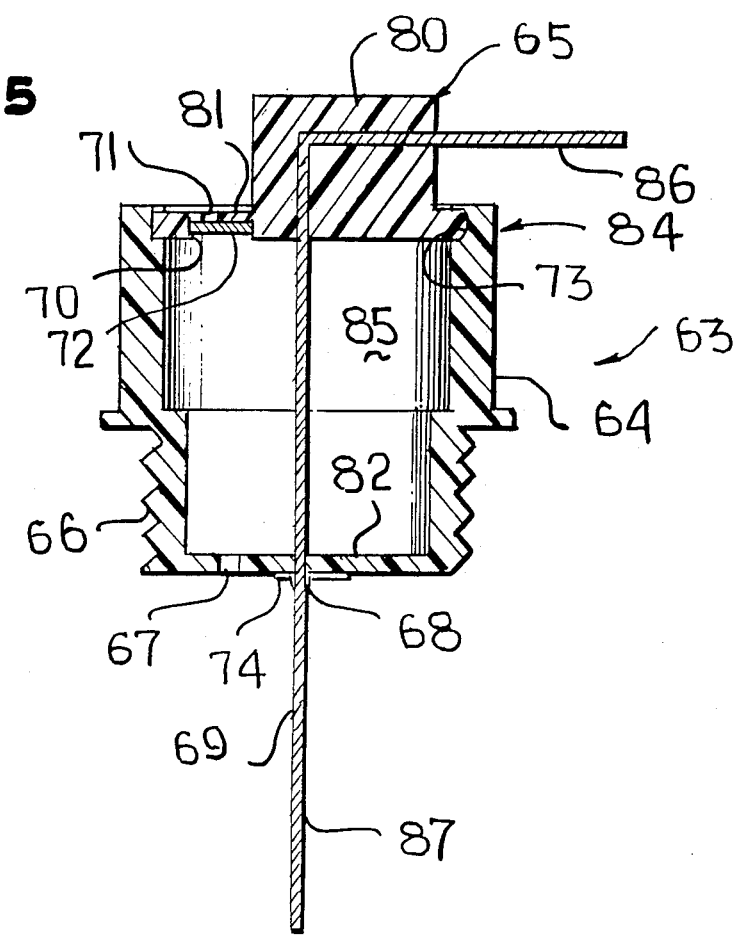

METHOD OF PROVIDING A INDICATION SIGNAL TO INDICATE A LEVEL OF ELECTROLYTE IN A WET CELL

This application is a division of application Ser. No. 07/246,786, filed Sept. 20, 1988, and now U.S. Pat. No. 4,913,987.

BACKGROUND OF THE INVENTION

1. Field of the Invention.

The present invention relates to novel improvements in battery monitors by which an individual cell in a wet cell battery may be monitored for variations in the level of electrolyte contained in the cell. More specifically, the invention relates to a universal electrolyte level indicator which may be attached to, and made part of, battery powered mobile equipment of all types for the purposes of providing a warning indication to the operator of the equipment that water needs to be added to the batteries contained therein.

2. Description of the Prior Art.

The prior art is replete with systems that indicate the electrolyte level within one or more cells of a wet cell battery. For example, U.S. Pat. Nos. 3,996,579; 3,891,465; 3,366,943; 2,779,015; 2,534,633 and 2,471,660 all describe systems for indicating battery electrolyte level drops using probes which are inserted into one or more cells and when the level of the fluid drops below a minimum acceptable level a circuit is completed which activates some type of warning device.

The prior art is likewise replete with devices that monitor state of charge (specific gravity) and/or temperature within a battery in addition to electrolyte level, as described in U.S. Pat. Nos. 4,625,201; 4,388,584; 4,329,406 and 4,247,188. The prior art also discloses the use of special materials to enhance the operational characteristics of the probes. German Patent No. 2,454,410 explains the use of tungsten carbide electrode accumulators, while British Patent No. 709,419 defines the use of platinum probes.

The prior art does not reveal an electrolyte level sensing device that may be used universally on batteries ranging from 6 vdc to 48 vdc without any modifications in circuit components or adjustments of any type whatsoever. Furthermore, the prior art has not addressed the special requirements associated with battery powered mobile equipment, such as the capability to monitor the level of electrolyte in a cell that is not electrochemically located between the positive and negative terminals of the battery used as the power source for the monitoring device. Additionally, no prior art was found that incorporates the use of double oscillators operating at different frequencies to produce a constant brightness of the indicating LED over a wide range of power source voltages in the context of the present invention as more fully described below.

Thus, notwithstanding the relatively substantial prior art in this particular field of technology, it is believed that the prior art neither teaches nor renders obvious the unique construction and universal operation of the electrolyte level indicator of the present invention.

SUMMARY OF THE INVENTION

The present invention is directed to an electrolyte level indicator, for use on wet cell batteries, that may be universally applied to any battery or group of batteries with a total voltage of 6 vdc to 48 vdc to monitor the electrolyte level in a single cell. The monitor includes a battery cap sensor probe that is inserted into a single cell of a wet cell battery and electrically connected, through a single wire, to a panel mounted transducer that indicates, by means of a flashing LED, that the electrolyte is below an acceptable level thereby producing a general indication that all the cells in the battery/batteries should be filled with water.

BRIEF DESCRIPTION OF THE DRAWINGS

FIG. 5 is a cross-sectional view of a preferred embodiment of the battery cap sensor probe of the present invention; and FIG. 6 is a top view of the battery cap sensor probe of the present invention.

DETAILED DESCRIPTION OF THE INVENTION AND DRAWINGS

It is well recognized that the level of electrolyte in wet cell batteries must cover the internal battery plates to maintain correct operation. When a battery is recharged, a certain amount of the electrolyte will evaporate as the battery reaches the gassing voltage, normally 2.37 volts per cell; thereafter the rate of evaporation will continue to increase until the battery reaches 2.52 volts per cell (full charge) and the charge cycle is terminated. If the level of electrolyte has not dropped below the top edge of the internal battery plates after the charging cycle is completed, the battery may be used at full rated capacity; however, if the level of electrolyte has dropped below the top edge of the plates and the battery is put in service, permanent internal damage and reduced capacity will result. For this reason, it is desirable to develop a system to monitor the level of electrolyte on a continuous basis that is more reliable than the conventional method of visual inspection and more universally usable than is allowed by existing electronic methods.

Equipment powered by wet cell batteries that are not normally removed from the equipment to be recharged are very susceptible to damage caused by a drop in the level of electrolyte because the operators don't normally check the level when they recharge the batteries. Some examples of this type of equipment are electric floor sweepers, golf carts, personnel carriers, etc. It is not uncommon for such equipment to be rendered inoperative because no means of warning was available to indicate that water should be added to the battery/batteries. The present invention was, thus, developed to provide a reliable, low cost warning device that could be permanently attached to, and universally operated on, several different types of mobile equipment regardless of the operating voltage.

Figure 1A:
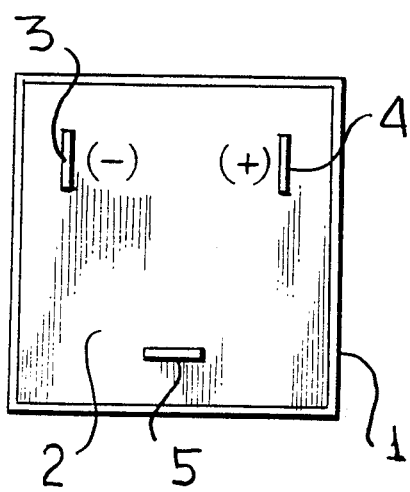
FIGS. 1A, 1B and 1C show the rear, side and front views respectively of the transducer in the preferred embodiment of the present invention.

Referring now specifically to the drawings, FIG. 1A shows a rear view of the transducer 1 in its fully assembled form. Transducer 1 is one part of a two part system that comprises the complete electrolyte level indicator.

In its preferred embodiment, the enclosure for transducer 1 is a plastic potting shell measuring 1½"×1½"×½" with an opening in the rear as shown. Protruding from the rear of transducer 1 are three spade type connectors 3, 4 and 5 which are internally connected to electronic circuits. During the assembly process an epoxy compound 2 is poured into the potting shell and, when fully cured, becomes part of transducer 1. The use of epoxy compound 2 provides a means of completely sealing the internal circuits of transducer 1.

Figure 1B:
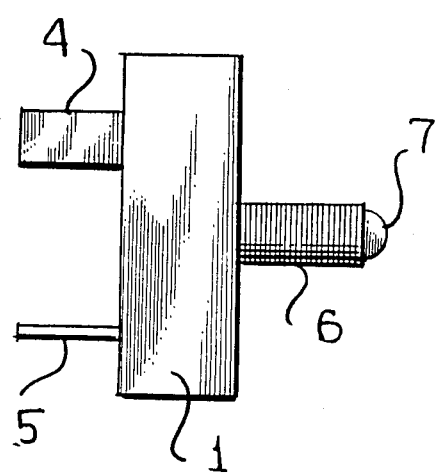

FIG. 1B shows a side view of transducer depicting a hollow metal bushing 6 which is threaded on its external surface. The bushing 6 extends forward through a centrally located hole in the potting shell of the transducer 1. Terminals 3, 4 and 5 extend rearward from transducer 1 to form electrical connectors. (The rearward extension of terminal 3 is not evident in the side view illustration.)

Figure 1C:
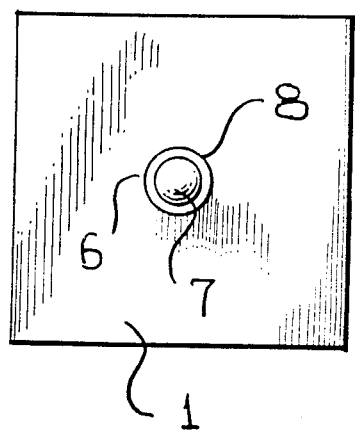

FIG. 1C shows a front view of transducer 1. Located inside bushing 6 is LED 7 which is connected to internal circuits. The top portion of metal bushing 6 contains an inward 45° bevel 8 that acts as a reflector for LED 7 when it is illuminated in much the same manner as the reflector of a normal flashlight. This method of construction allows transducer 1 to be mounted through a single hole in an instrument panel and held secure by tightening a nut with threads that match the threads on the external surface of bushing 6. As a result, bushing 6 serves the dual purpose of providing a means of mounting transducer 1 and a reflective means of increasing the viewing angle of LED 7.

Figure 2:
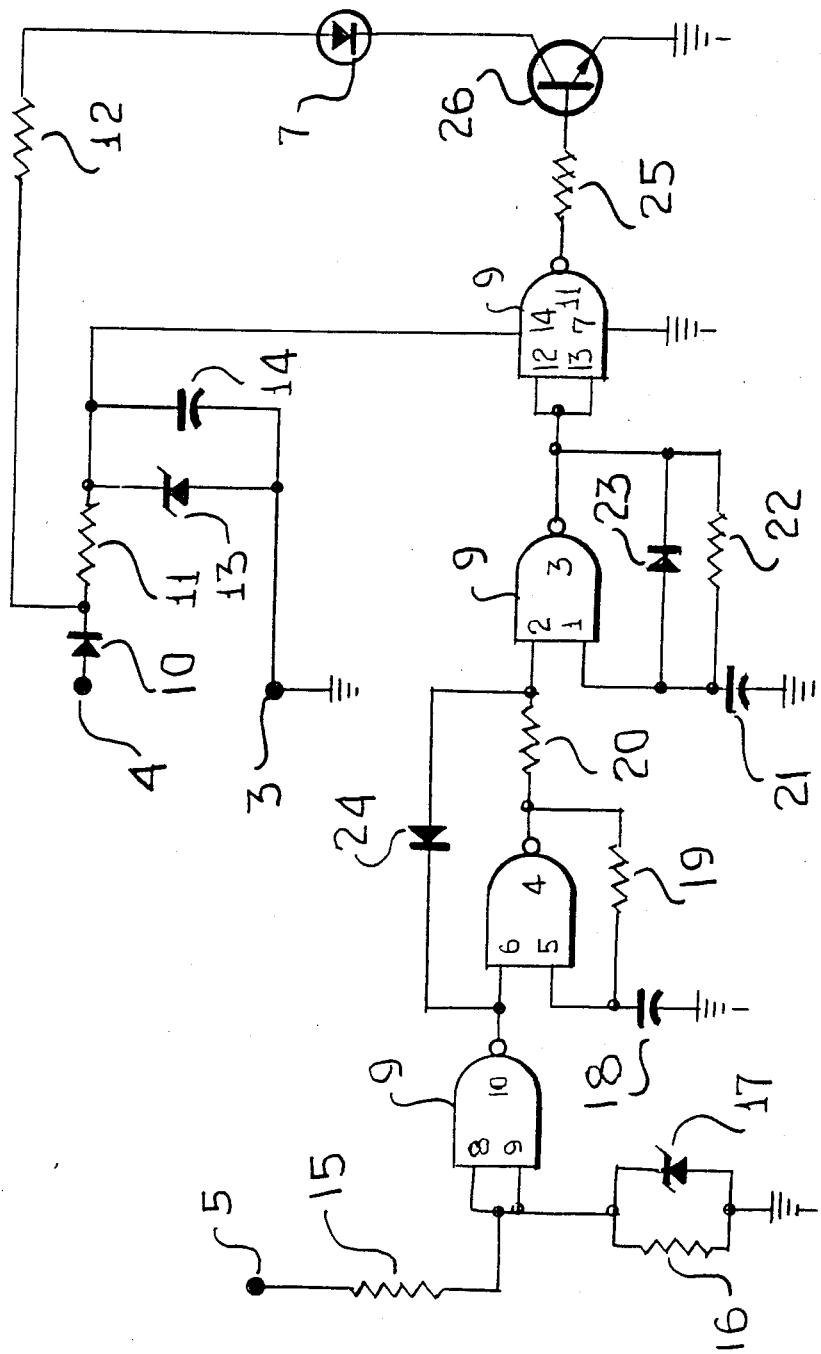
FIG. 2 shows a schematic diagram of the preferred circuitry of the present invention.

FIG. 2 is a schematic diagram of the preferred embodiment of the circuitry inside transducer 1. The circuit uses a CMOS Quad 2-input NAND gate such as a CD4093; each of the four gates 9 are shown individually with pin numbers assigned to the appropriate input and output pins. Terminal 3 is connected to the negative battery terminal thus serving as the negative side of the power supply for the circuit of FIG. 2. If more than one battery is used, for example, when a group of batteries are connected in series to obtain a higher total voltage, terminal 3 is connected to the most negative battery terminal of the serially connected combination of batteries. Terminal 4 is connected to the positive battery terminal when a single battery is used, such as a single 6 v or 2 v battery, or any positive battery terminal in a serially connected combination of batteries if more than one battery is to be used. The maximum input voltage to terminal 4 from a D.C. power source is 65 vdc which will accommodate a 48 v battery that is being recharged. In order to make the detector system capable of operating at various battery voltages from 6 vdc to 48 vdc it is necessary to include the increase in battery voltages that will occur when the battery is recharged. When a 48 v battery or a serially connected group of batteries with a total rated voltage of 48 volts is recharged, the actual applied voltage from the battery charger will be 60.48 volts (48 v battery combination is comprised of 24 cells, times a full charge voltage of 2.52 volts per cell=60.48 volts). Terminal 4 accepts the positive voltage required to operate the circuit of FIG. 2.

The anode side of rectifier 10 is connected to terminal 4 and the cathode side of the rectifier 10 is connected to one end of resistor 11. The other end of resistor 11 is connected to the cathode of a 10 v zener diode 13 and the positive side of filter capacitor 14 and to the positive supply pin 14 of integrated circuit 9 (hereinafter referred to as IC-9). The anode side of zener diode 13 and the negative side of capacitor 14 are connected to a circuit ground point which is electrically the same as terminal 3. The circuit comprised of rectifier 10, resistor 11, zener diode 13 and capacitor 14 provides a voltage limited source of power to IC-9. The voltage applied to pin 14 or IC-9 will increase or decrease in proportion to the input voltage applied to terminal 4; however, the maximum voltage that is allowed to pass through to pin 14 of IC-9 will be limited to 10 vdc. This power supply circuit is used instead of a conventional 3-pin voltage regulator to allow enough current to be passed to IC-9 to maintain correct circuit operation at the low voltage limit of 6 vdc. Using conventional voltage regulators would not allow this to occur. With 6 vdc applied to terminal 4, the supply voltage presented to pin 14 of IC-9 will be 4.5 vdc. When the maximum input voltage of 60.48 v (48 v battery being recharged) is applied to terminal 4, the supply voltage to IC-9 will be limited to 10 vdc, thereby adhering to the operating limitations of IC-9 which are no less than 3 vdc or no more than 18 vdc.

The probe input terminal 5 is serially connected through resistor 15 to input pins 8 and 9 of IC-9. The input pins 8 and 9 are also serially connected to a parallel circuit comprised of resistor 16 and 10 v zener diode 17 to ground. This circuit limits the input voltage applied to pins 8 and 9 of IC 9 to a maximum of 10 volts thereby allowing the probe input terminal 5 to convert much higher voltages obtained at individual battery cells to low lever logic voltages that will activate inputs 8 and 9 of IC-9 without causing damage. Since IC-9 is a CMOS integrated chip and, thus, capable of operating at very low currents; the input current passing through terminal 5 never exceeds 2 ma (2/1,000-amp), thus eliminating any possibility of arcing inside a battery cell when terminal 5 is connected to an appropriate sensor. During operation, terminal 5 will be at some positive voltage level with respect to ground (most negative battery terminal) determined by the location of the cell being monitored. This occurs due to the ability of the electrolyte in a wet cell to produce a voltage equal to its relative proximity to the most negative terminal of the battery/batteries. When an appropriate sensor is in contact with the electrolyte in a battery, a resistor divider network comprised of resistors 15 and 16 presents the positive voltage to input pins 8 and 9 of IC-9 which causes the output pin 10 of IC-9 to remain at ground potential (low).

Figure 3A:
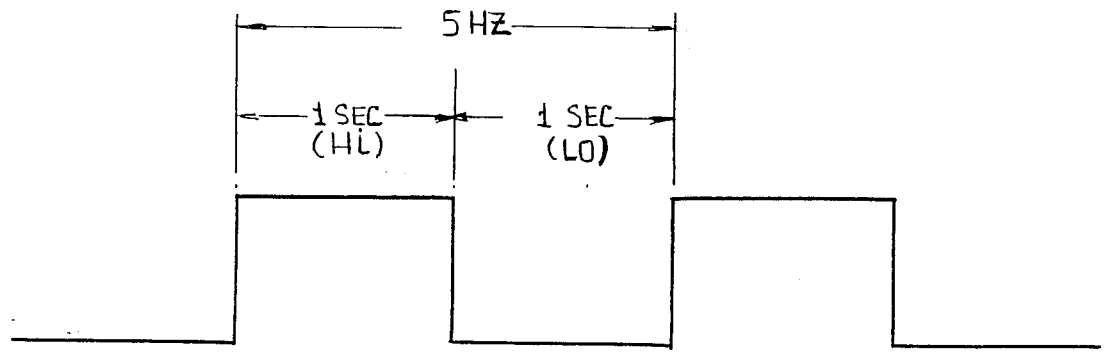
FIGS. 3A, 3B and 3C show waveform representations that will illustrate the operation of the circuits in FIG. 2.

When the level of the electrolyte drops below a predetermined point, established by an appropriate sensor, the positive voltage going to terminal 5 is removed which allows resistor 16 to pull inputs 8 and 9 of IC-9 low causing output pin 10 to go high, thus providing a means of turning the circuit on and off, and eliminating the need for any type of reset button. Output pin 10 of IC-9 is connected to the input pin 6 of the next gate of IC-9. Pin 5 of IC-9 is connected through capacitor 18 to ground and also through resistor 19 to output pin 4 of the same gate of IC-9. This circuit combination will cause output pin 4 to oscillate at a predetermined frequency when input pin 6 is high. If input pin 6 of IC-9 goes low and remains low, pin 4 will go high and remain high, thus stopping the oscillation. Component values are selected for capacitor 18 and resistor 19 to produce a 50% duty cycle oscillator running at a frequency of 0.5-HZ (1-sec high, 1-sec low). The output frequency at pin 4 of IC-9 during oscillation is shown graphically in FIG. 3A.

Figure 3B:
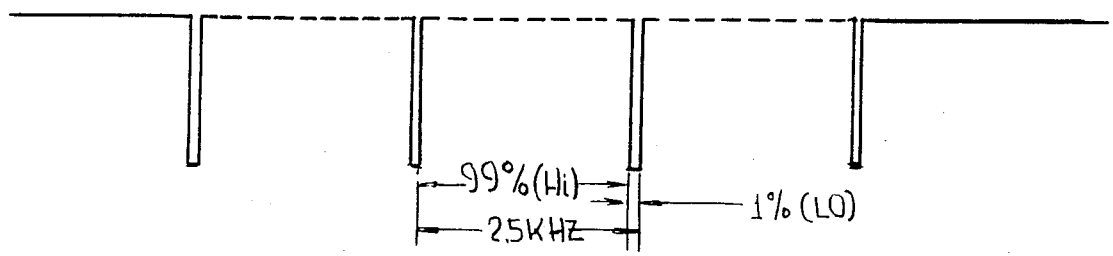

Resistor 20 is serially connected between the output pin 4 of IC-9 to the input pin 2 of the next gate of IC-9. Pin 1 of IC-9 is connected through capacitor 21 to ground and also through resistor 22 to output pin 3 of the same gate of IC-9. Connected parallel across resistor 22 is diode 23 with the anode connected to pin 1 of IC-9, thereby producing a second oscillator with a very short off (low) time. The output pin 3 of this second oscillator will oscillate when pin 2 of IC-9 is high. Component values are selected for capacitor 21 and resistor 22 to produce a 2.5-KHZ output frequency. Diode 23 provides a very low resistance discharge path for capacitor 21 which reduces the low portion of the duty cycle of the second oscillator to 1%. The output frequency at pin 3 of IC-9 is shown graphically in FIG. 3B to illustrate the ratio of the duty cycles.

Figure 3C:
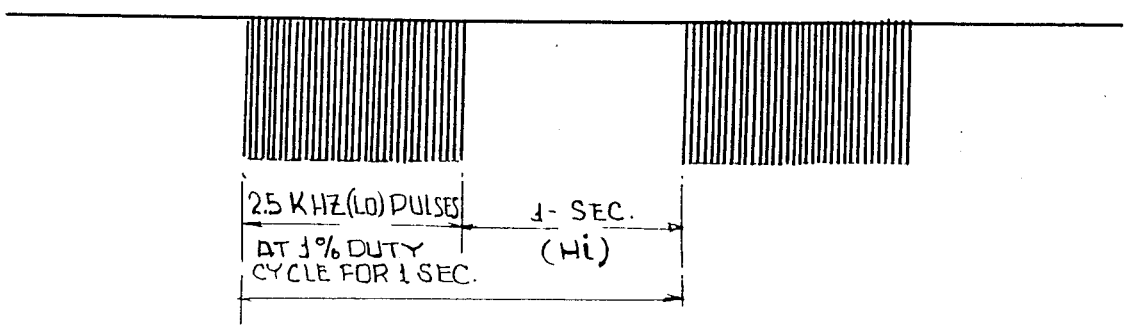

When pin 6 of IC-9 receives a high signal which activates the circuit; the output of the first oscillator (pin 4 of IC-9) is used to energize input pin 2 of the second oscillator through serially connected resistor 20. The connection of the output of the first oscillator to the input of the second oscillator produces a burst of 1% duty cycle pulses, at a 2.5-KHZ rate, at the output of the second oscillator pin 3 of IC-9. The burst of pulses occur at regular intervals one second apart as shown graphically in FIG. 3C. Diode 24 is connected between pin 6 and pin 2 of IC-9 with the anode connected to pin 2 to cause both oscillators to turn off when the pin 6 of IC-9 goes low. In each case the off condition of the oscillators will cause the respective outputs to go to and remain at a high state.

The output of the second oscillator at pin 3 of IC-9 is connected to pins 12 and 13 of the next gate of IC-9 which functions as an inverter. When input pins 12 and 13 are high, output pin 11 is low and vice-versa. Pin 11 is serially connected through resistor 25 to the base of a NPN transistor 26 which may also be a FET (Field Effect Transistor) or any other type of solid state switching device. The emitter lead of transistor 26 is connected to ground while the collector lead of transistor 26 is connected to the cathode of LED 7. The anode of LED 7 is serially connected through resistor 12 to the cathode side of rectifier 10. Other types of signaling devices such as lamps, buzzers, audio transducers, etc., may be used in place of LED 7 without affecting circuit operation. When the circuit is activated, the base of transistor 26 receives pulses generated by the foregoing oscillators and turns on and off accordingly. Transistor 26 thus provides a ground return path for currect flow through resistor 12 and LED 7. The source of power used to energize the LED is taken from the input voltage present at terminal 4, through rectifier 10 which would normally be much too high a voltage to apply directly to LED 7 without causing damage; however, because the voltage is switched through LED 7 at a 2.5-KHZ rate, with a 1% duty cycle, LED 7 emits a higher than normal brightness without being damaged. The high frequency/low duty cycle method of applying power to LED 7 also provides a means of obtaining a relatively constant brightness through the entire operating range of 6 vdc to 48 vdc. As a result of the burst of 2.5-KHZ pulses for a duration of one second followed by the absence of any pulses for one second; LED 7 appears to flash on and off at one second intervals when the circuit of FIG. 2 is activated. Resistor 12 may be included in the circuit serially connected between rectifier 10 and LED 7 to limit the brightness of LED 7 if desired; however, the circuit will operate correctly if LED 7 is connected directly to rectifier 10 without resistor 12 to limit the current.

It should be noted that other types of integrated circuits such as counters, timers or special function chips may be used to duplicate the circuit operation as described above; however, IC-9 was selected as the most cost effective integrated circuit to provide the desired results.

Figure 4:
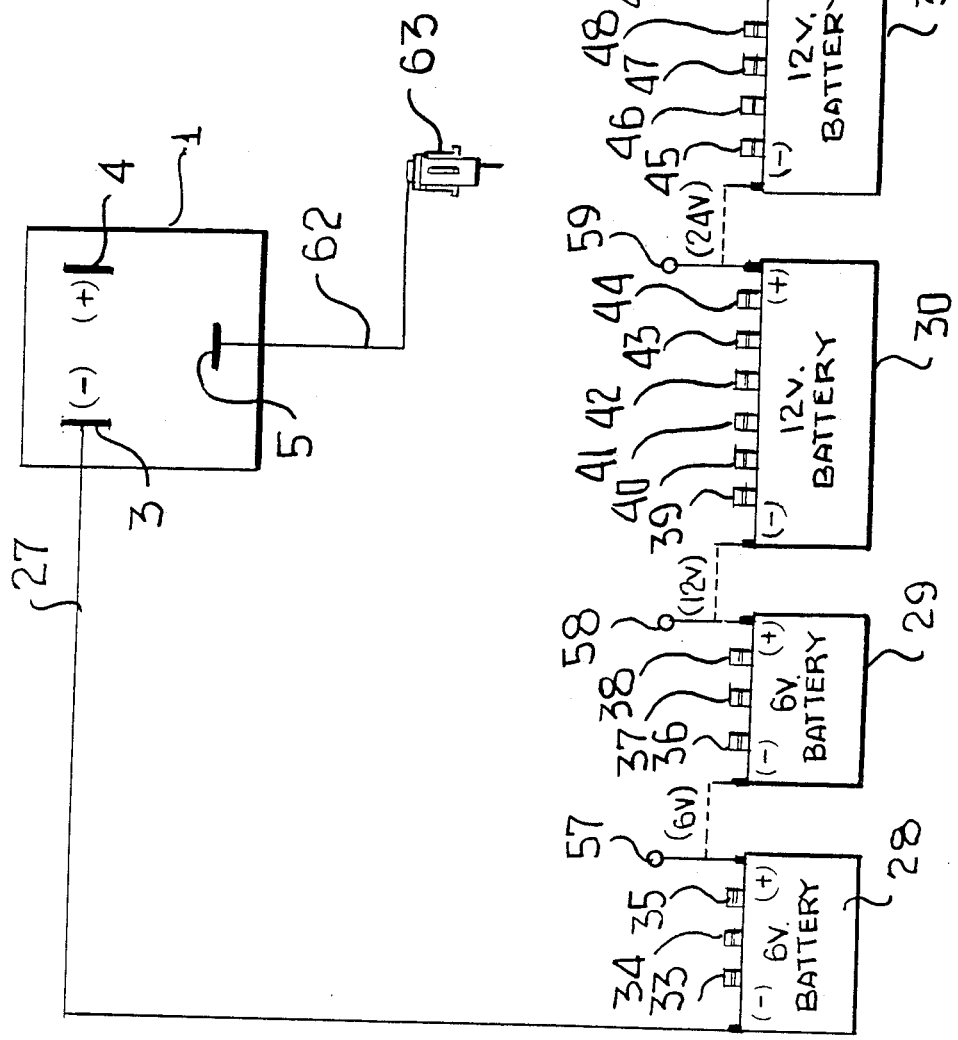
FIG. 4 shows the various methods of interconnection for standard and non-standard applications of the present invention.

FIG. 4 shows a pictorial illustration of the possible interconnections of the present invention to a single battery or a group of batteries connected in series for the purpose of obtaining a higher voltage as a source of power to operate various types of mobile equipment. FIG. 4 shows the negative connector 3 of transducer 1 connected to the negative battery terminal of battery 28 through wire 27. If only a single 6 v battery were being used as the source of power for the mobile equipment, it would likewise be the only source of power for the present invention and would, therefore, require that the positive connector 4 of transducer 1 be connected to the positive battery terminal 57 of the 6 v battery 28. The battery cap sensor probe 63 would be electrically connected to connector 5 of transducer 1 through wire 62 and physically inserted into one of the cells in battery 28. In order to insert sensor probe 63 into one of the cells of battery 28, one of the conventional battery caps 33, 34 or 35 in battery 28 would have to be removed and discarded to allow for the installation of sensor probe 63. When the present invention is used in an application where a single 6 v battery is the total source of power, as defined above, the location of the cell selected for insertion of sensor probe 63 is of prime importance. the circuit of FIG. 2 allows transducer 1 to operate over a wide range of voltages, however, the internal circuit voltage of transducer 1 is only 4.5 volts when powered from a 6 v battery. The circuitry of transducer 1 requires that the voltage applied to connector 5 of transducer 1 be at least one half (2.25 volts) of the internal circuit voltage to operate correctly. The reason for this requirement is based upon the transfer characteristics of IC-9 in the circuit of FIG. 2; which requires that the voltage applied to any input of IC-9 must be at least one half of the voltage used to supply power to IC-9 to cause the corresponding output to change state.

As a result, the cell selected in battery 28 for insertion of sensor probe 63 must be capable of producing a voltage of at least 2.25 volts. Since individual cells in a wet cell battery generally produce 2 volts per cell, it would be necessary to insert sensor probe 63 in place of battery cap 34 (the second cell from the most negative battery terminal) in battery 28 to obtain a voltage high enough to activate the circuits of transducer 1; or sensor probe 63 could be inserted in place of battery cap 35 (the third cell) and still operate correctly. If we now serially connect the two 6 v batteries 28 and 29 together to produce a 12 v battery source and connect the positive connector 4 of transducer 1 to the positive battery terminal 58 of battery 29, the interconnections will be complete for operation at 12 volts. When transducer 1 is powered from a 12 v source, the internal circuits of FIG. 2 will be operating from an internally derived source of 8.5 volts which means that connector 5 of transducer 1 must receive a voltage of at least 4.25 volts (one half the internal voltage of FIG. 2) to operate correctly. It would now be necessary to insert the sensor probe 63 in place of battery cap 35 (the third cell) to obtain a voltage high enough to activate the circuits in transducer 1. Since two 6 v batteries connected in series are an exact equivalent to one 12 v battery, both containing 6 cells, the above configuration would directly apply to operation from a single 12 v battery. If we now serially connect the 6 v batteries 28 and 29 and the 12 v batteries 30 and 31 to produce a total battery voltage of 36 volts and connect the positive connector 4 of transducer 1 to the positive battery terminal 60 of battery 31, the interconnections will be complete for operation at 36 volts. When the transducer 1 is powered from a 36 v source, the internal circuits of FIG. 2 will be operating from an internally derived source of 10 volts which means that connector 5 of transducer 1 must receive a voltage of at least 5 volts to operate correctly; however, it is evident that the required sensing voltage is available without moving the location of sensor probe 63. Thus, it is possible to operate the present invention universally on batteries ranging in voltage from 6 v to 48 v by inserting sensor probe 63 into a single cell located three cells from the most negative battery terminal. Since the circuits of FIG. 2 convert the voltage applied to connector 5 to low level logic signals, it is possible to insert the sensor probe in any cell producing a voltage up to 65 vdc, thus making it possible to locate sensor probe 63 in any cell (in the place of battery cap 35 up to battery cap 56) and still obtain correct operation.

A unique feature of the present invention is the capability to monitor a cell that is not electro-chemically located between the positive and negative terminals of the battery source used to supply power to the monitoring device. This can be shown by example if the serial innerconnections are retained for 36 v operation, but the sensor probe is relocated in place of battery cap 56 of battery 32. In this location sensor probe 63 will be monitoring a voltage of 48 volts which is within an acceptable range for the circuits of transducer 1, yet well above the operating voltage of transducer 1. In an extreme case the same would hold true if the operating voltage was 6 vdc and the monitored voltage was 48 vdc, thus rendering the present invention truly universal. The need to monitor a cell producing a voltage that is higher than the system operating voltage is often required in mobile equipment that obtains different voltages for operating various devices such as motors, compressors, etc. by tapping a serially connected group of batteries at various battery terminals.

FIG. 5 shows a cross-sectional view of the preferred embodiment of the battery cap sensor probe 63 comprised of a base 64 with a "snap-fit" cap insert 65. Base 64 and insert 65 are each a one-piece molding made from a non-corrosive material such a polypropylene that will not be affected by direct contact with the acid solution contained within a wet cell battery. Base 64 and insert 65 define a generally hollow body 84 having an interior chamber 85. In this particular embodiment the base 6 is a hollow tubular structure with threads 66 formed in the lower portion as depicted in FIG. 5 to allow the sensor probe 63 to be screwed into a single cell of a wet cell battery with matching threads. The threads 66 may be of various sizes to accommodate different thread sizes in various batteries. In a like manner the lower portion of base 64 may be molded to accommodate either a push-in or bayonet type receptacle in various types of batteries. The bottom surface of base 64 contains a ⅛" vent hold 67 to allow gases that are created inside a wet cell to pass through. Centrally located in the bottom surface of base 64 is slot 68 measuring 0.250"×0.035" to allow the lower extension of probe plate 69 to pass through the bottom surface of base 64. The top of cap insert 65 contains a raised section 80 (as shown in FIG. 6) to provide for the integral molding of probe plate 69 into cap insert 65. The cap insert 65 is disc-shaped with the 90° angular portion (unnumbered) of probe plate 69 molded therein forming a single structure, as shown in FIG. 5. Located in the bottom surface of cap insert 65 is a counterbore 70 that provides a circular depression in the bottom surface of cap insert 65. Centrally located in the counterbore 70 is a thru hole 71 providing an opening to the top surface of cap insert 65. Pressed into counterbore 70 is porous disc 72 which acts as a flame arrester, thus allowing gases escaping from the wet cell to flow through vent hole 67 in the bottom wall 82 of the base 64 up through the interior chamber, through disc 72 and out through hole 71 in the flat portion 81 of cap insert 65. The use of disc 72 prevents an open flame from entering into sensor probe 63, yet allows internal gases to escape.

Located around the internal circumference of the upper portion of base 64 is an inwardly opening peripheral groove 73 extending into the inside wall of base 64. The outer peripheral edge of the flat portion 81 of cap insert 65 is molded to a tolerance relative to counterbore 73 to allow cap inset 65 to "snap-fit" into counterbore 73. The bottom edge of the flat portion 81 of cap insert 65 contains in inward 45° bevel to provide a means of introducing cap insert 65 into counterbore 73 prior to applying enough pressure to cause cap insert 65 to "snap-fit" into counterbore 73. A spring-type retainer clip (torsion spring 74) is inserted upon the probe plate 69 adjacent to bottom wall 82 of the base 64 which prevents the cap insert 65 from separating from the base 64 when upward pressure is inadvertently applied to an end portion 86 of the probe plate 69 while inserting a push-on electrical connector thereto. Probe plate 69 is made from a conductive metal such as No. 314 stainless steel that is, to a reasonable extent, resistant to corrosion caused by the acid solution contained in a wet cell battery. A portion 87 of probe plate 69 extends below the bottom wall 82 of base 64 an appropriate length to enable probe plate 69 to detect the correct level of electrolyte in a wet cell. The portion 86 of probe plate 69 that extends beyond the molded portion of cap insert 65 is used as an electrical connector to connect the sensor probe 63 to transducer 1 through wire 62. Probe plate 69 is prevented from pulling loose due to the 90° bend that is molded into, and made a part thereof, of cap insert 65. Cap insert 65 is prevented from twisting in base 64 due to the penetration of probe plate 69 through slot 68 in the bottom of base 64; thereby withstanding forces applied to probe plate 69 when a mating electrical connector is attached thereto.

Although the invention has been described relative to an exemplary embodiment thereof, it will be understood that other variations and modifications can be effected in this embodiment without departing from the scope and the spirit of the invention.

What is claimed is:

1. A method of providing an indication signal to indicate when a battery sensor senses that a monitored parameter achieves at least a threshold state, comprising the steps of:

(a) detecting the presence or absence of a signal from said battery sensor;

(b) determining if said signal received from said battery level sensor indicates that said monitored parameter has at least achieved said threshold state;
(c) when said monitored parameter has at least achieved said threshold state, providing an appropriate trigger signal;
(d) providing a first oscillating signal which oscillates at said first frequency in response to provision of the appropriate trigger signal;
(e) providing a second oscillating signal which oscillates at said second frequency, that is different from said first frequency, in response to provision of said first oscillating signal; and
(f) using said second oscillating signal to provide said indication signal.

2. The method of claim 1 wherein said monitored parameter comprises a level of electrolyte contained in a cell of a battery.

3. The method of claim 1 wherein said second frequency is higher than said first frequency.

4. The method of claim 1 wherein said first frequency is about 0.5 Hz and said second frequency is about 2.5 KHz.

5. The method of claim 1 wherein said first oscillating signal has a duty cycle of about 50% and said second oscillating signal has a duty cycle of about 1%.

6. The method of claim 1 wherein said first oscillating signal has a frequency of about 0.5 Hz and a duty cycle of about 50%, and said second oscillating signal has a frequency of about 2.5 KHz and a duty cycle of about 1%.

* * * * *